United States Patent
Lin et al.

(10) Patent No.: US 10,890,612 B2
(45) Date of Patent: Jan. 12, 2021

(54) INSULATION RESISTANCE MEASURING DEVICE

(71) Applicant: Foxlink Automotive Technology (Kunshan) Co., Ltd., Kun Shan (CN)

(72) Inventors: Pao Hung Lin, New Taipei (TW); Po Shen Chen, New Taipei (TW); Kuo Ho Cheng, New Taipei (TW); Ming Chun Chang, New Taipei (TW); Tsai Fu Lin, New Taipei (TW)

(73) Assignee: Foxlink Automotive Technology (Kunshan) Co., Ltd., Kun Shan (CN)

( * ) Notice: Subject to any disclaimer, the term of this patent is extended or adjusted under 35 U.S.C. 154(b) by 60 days.

(21) Appl. No.: 16/215,572

(22) Filed: Dec. 10, 2018

(65) Prior Publication Data

US 2020/0018786 A1 Jan. 16, 2020

(30) Foreign Application Priority Data

Jul. 16, 2018 (TW) .............................. 107124736 A

(51) Int. Cl.
*G01R 31/00* (2006.01)
*G01R 31/12* (2020.01)

(52) U.S. Cl.
CPC ....... *G01R 31/007* (2013.01); *G01R 31/1272* (2013.01)

(58) Field of Classification Search
CPC ............. G01R 31/007; G01R 31/1272; G01R 27/025; G01R 27/02; G01R 31/005; G01R 31/006; G01R 31/008; G01R 31/58; G01R 27/2671

USPC ................................ 324/503, 541, 544, 551
See application file for complete search history.

(56) References Cited

U.S. PATENT DOCUMENTS

| | | | | |
|---|---|---|---|---|
| 8,779,784 B2* | 7/2014 | Yang | ...................... | G01R 27/16 324/691 |
| 2007/0176604 A1* | 8/2007 | Morimoto | .............. | G01R 27/18 324/525 |
| 2013/0314097 A1* | 11/2013 | Hausberger | .......... | G01R 27/025 324/503 |
| 2014/0095093 A1* | 4/2014 | Hong | ..................... | G01R 31/50 702/63 |
| 2014/0159908 A1* | 6/2014 | Hong | ..................... | G01R 31/50 340/636.1 |

(Continued)

*Primary Examiner* — Tung X Nguyen
*Assistant Examiner* — Robert P Alejnikov, Jr.
(74) *Attorney, Agent, or Firm* — Idea Intellectual Limited; Margaret A. Burke; Sam T. Yip

(57) ABSTRACT

An insulation resistance measuring device for detecting insulation resistance of an electric vehicle comprises a battery system, a measuring unit, a control unit and a calculation unit. The measuring unit comprises a circuit module comprises a plurality of resistances connected between a positive side and a negative side of the battery system, a first switch, a second switch, and a voltage detecting unit. The first switch is connected between the circuit module and a ground side. The second switch is connected between the circuit module and the negative side. The voltage detecting unit is arranged at a connecting node of the resistances of the circuit module. The control unit is configured to control the first switch and the second switch to turn on or turn off. The calculation unit is configured to calculate a high potential insulation resistance and a low potential insulation resistance of the electric vehicle.

10 Claims, 14 Drawing Sheets

(56) References Cited

U.S. PATENT DOCUMENTS

| | | | |
|---|---|---|---|
| 2017/0160327 A1* | 6/2017 | Jung | G01R 31/3644 |
| 2017/0227589 A1* | 8/2017 | Kawanaka | G01R 31/3277 |
| 2017/0328940 A1* | 11/2017 | Choi | G01R 27/18 |
| 2018/0074108 A1* | 3/2018 | Dulle | G01R 31/364 |
| 2018/0074113 A1* | 3/2018 | Sung | G01R 31/1227 |

* cited by examiner

INSULATION RESISTANCE MEASURING DEVICE

CROSS-REFERENCE TO RELATED APPLICATION

The present application is based on, and claims priority from, Taiwan Patent Application No. 107124736, filed Jul. 16, 2018, the disclosure of which is hereby incorporated by reference herein in its entirety.

BACKGROUND OF THE INVENTION

1. Field of the Invention

The present invention generally relates to a measuring device for measuring an insulation resistance, more particularly, the measuring device for the measuring insulation resistance of an electric vehicle.

2. The Related Art

Referring to FIG. 1, at present, an electric vehicle 90 usually includes a high voltage battery system 91 and a motor system 92, the high voltage battery system 91 is connected to the motor system 92 and installed in a vehicle body 93.

However, it can be found that the electric vehicle in a variety of external environment is easily caused to damage an insulation resistance of the electric vehicle, which may lead to the risk of electric shock. Therefore, it is necessary to monitor the insulation resistance of the electric vehicle and alarm a user to prevent accident in time.

Referring to FIG. 2 to FIG. 4, at present, a conventional insulation resistance measurement 80 includes a system module 81, two measuring modules 82, a first voltage detection apparatus (not shown) and a second voltage detection apparatus (not shown). The system module 81 comprises a power system 811 and a control system 812, and the system module 81, which is connected between a positive side 911 and a negative side 912 of the high voltage battery system 91, an insulation resistance RH(Rp) is connected between the positive side 911 of the high voltage battery system 91 and a ground side 931 of the vehicle body 93, an insulation resistance RL(Rn) is connected between the negative side 912 of the high voltage battery system 91 and the ground side 931 of the vehicle body 93. One measuring module 82 is connected in parallel with the insulation resistance RH(Rp) and the other measuring module 82 is connected in parallel with the insulation resistance RL(Rn), each measuring module 82 comprises a switch 821 and a resistance Ro, which are connected in series. The first voltage detection apparatus is connected between the positive side 911 and the negative side 912 of the high voltage battery system 91 for detecting a total voltage between the positive side 911 and the negative side 912, and the second voltage detection apparatus is connected between the negative side 912 of the high voltage battery system 91 and the ground side 931 for detecting a voltage between the negative side 912 and the ground side 931.

The measurement steps are as follows: First, the first and the second voltage detection apparatus detect the voltages between the positive side 911 and the negative side 912 of the high voltage battery system 91, and then, calculate a voltage Vp of the insulation resistance Rp and an voltage Vn of the insulation resistance Rn when the switch 821 is turned off, moreover, calculate a voltage Vp' of the insulation resistance Rp and a voltage Vn' of the insulation resistance Rn when the switch 821 is turned on. Finally, the Rn and Rp are determined by circuit equations, equations are obtained as follows.

$$Rn = \left(\frac{Vp'}{Vp} \times \frac{Vn}{Vn'} - 1\right) \times Ro,\ Rp = \frac{Vp}{Vn} \times Rn = \left(\frac{Vp'}{Vn'} - \frac{Vp}{Vn}\right) \times Ro$$

Although the conventional insulation resistance measurement 80 uses the measuring module 82 with a simple structure, but the additional first voltage detection apparatus (not shown) and the second voltage detection apparatus (not shown) which can detect the voltage between the endpoints are required, and then further calculated the voltage values Vp, Vn when the switch is turned OFF, and the voltage values Vp', and Vn' when the switch 821 is turned on. Furthermore, the first voltage detection apparatus and the second voltage detection apparatus cannot be disconnected after finishing the measurement, which influences the measured value of the insulation resistance Rn, Rp. Moreover, each the voltage detection apparatus requires one analog-to-digital converter (ADC) which increases manufacture cost. Therefore, it is necessary to design an insulation resistance measuring device which is low in cost and can accurately measure the insulation resistance to ensure the safety of the battery system 91 to the human body.

SUMMARY OF THE INVENTION

The present invention provides an insulation resistance measuring device for measuring insulation resistance of an electric vehicle that is relatively low in cost and more accurate measurement.

The insulation resistance measuring device of the invention comprises a battery system and a ground side. A positive electrode insulation resistance is a resistance between a positive side of the battery system and the ground side. A negative electrode insulation resistance is a resistance between a negative side of the battery system and the ground side.

Accordingly, the insulation resistance measuring device comprises a measuring unit, a control unit and a calculation unit.

The measuring unit comprises a circuit module, a first switch, a second switch and a voltage detecting unit.

The circuit module comprises a plurality of resistors, and the circuit module is connected between the positive side and the negative side of the battery system.

The first switch is connected between the circuit module and the ground side.

The second switch is connected between the circuit module and the negative side.

The voltage detecting unit is arranged at a connecting node of the circuit module.

A control unit is configured to control the first switch and the second switch to turn on or turn off.

A calculation unit is connected to the voltage detecting unit and configured to calculate following content.

The calculation unit is configured to acquire a first voltage of the connecting node via the voltage detecting unit when the first switch and the second switch are in a first state.

The calculation unit is configured to calculate a second voltage between the positive side and the negative side by using the first voltage in a first circuit equation.

The calculation unit is configured to acquire a third voltage of the connecting node via the voltage detecting unit when the first switch and the second switch are in a second state.

The calculation unit is configured to calculate a fourth voltage between the ground side and negative side by using the third voltage in a second circuit equation.

The calculation unit is configured to acquire a fifth voltage of the connecting point via the voltage detecting unit when the first switch and the second switch are in a third state.

The calculation unit is configured to calculate a sixth voltage between the ground side and negative side by using the fifth voltage in a third circuit equation.

The calculation unit is configured to calculate a seventh voltage between the positive side and the ground side when the first switch and the second switch are in the second state, the seventh voltage is that the second voltage minus the fourth voltage.

The calculation unit is configured to calculate an eighth voltage between the positive side and the ground side when the first switch and the second switch are in the third state, the eighth voltage is that the second voltage minus the sixth voltage.

The calculation unit is configured to operate a first function being a function consisting of the fourth voltage, the sixth voltage, the seventh voltage and the eighth voltage.

The calculation unit is configured to operate a second function and a third function for obtaining the positive electrode insulation resistance and the negative electrode insulation resistance, the second function is a function consisting of the first function and the resistances of resistors of the circuit module, and the third function is a function consisting of the first function, the resistances of resistors of the circuit module, the fourth voltage, the seventh voltage and the second function.

BRIEF DESCRIPTION OF THE DRAWINGS

The present invention will be apparent to those skilled in the art by reading the following description, with reference to the attached drawings, in which:

FIG. 4 is a circuit diagram of the conventional measuring module, wherein the switch is turned on;

FIG. 13 is a circuit diagram of the second embodiment of the insulation resistance measuring device of the present invention, wherein the first switch is turned on and the second switch is turned on;

DETAILED DESCRIPTION OF THE PREFERRED EMBODIMENT

The following detailed description is merely exemplary in nature and is not intended to limit the applications and uses disclosed herein. Further, there is no intention to be bound by any theory presented in the preceding background or summary or the following detailed description.

Figure 1:
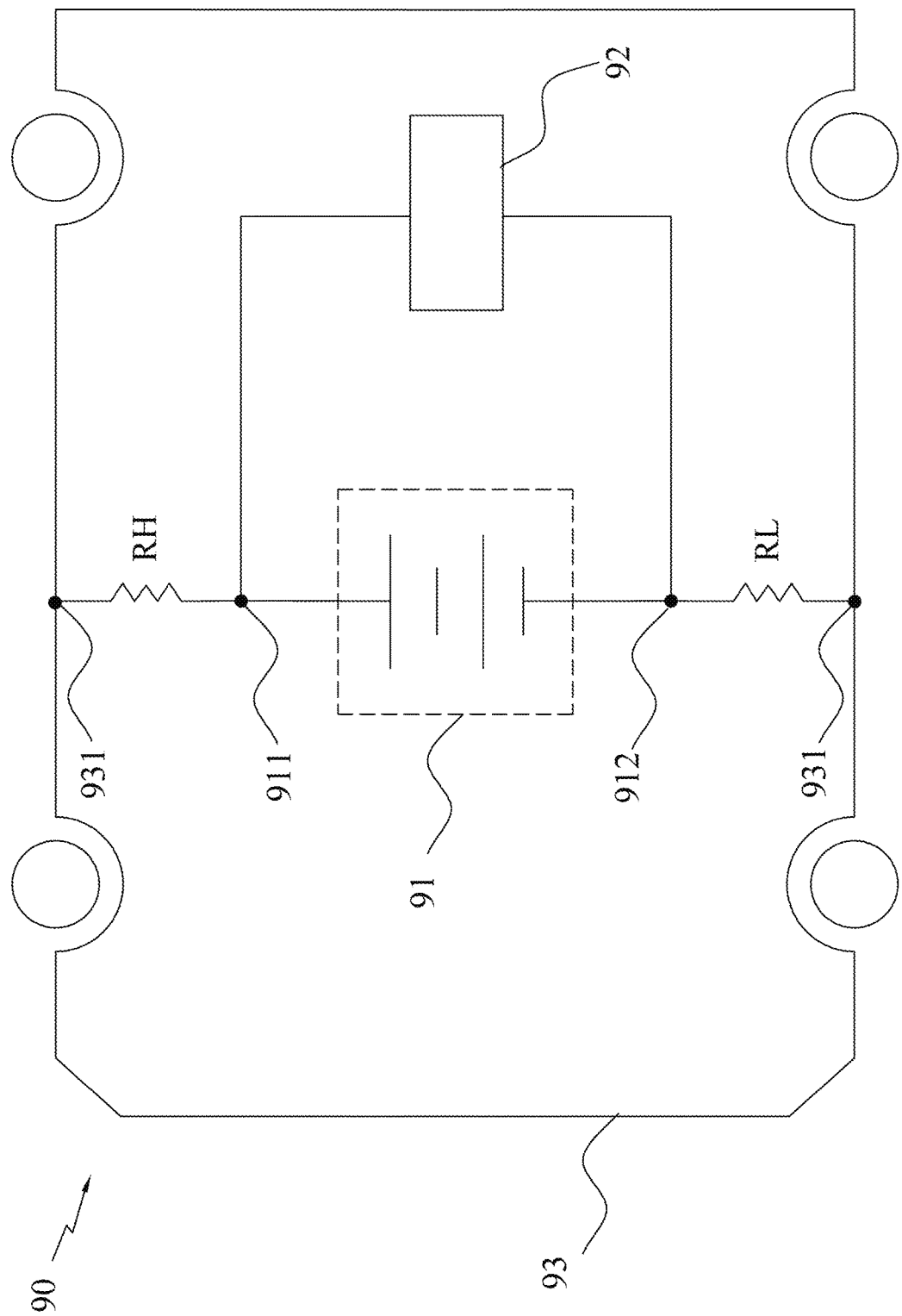
FIG. 1 is a schematic diagram illustrating a high voltage battery system and a motor system being applicable to an electric vehicle.
Figure 2:
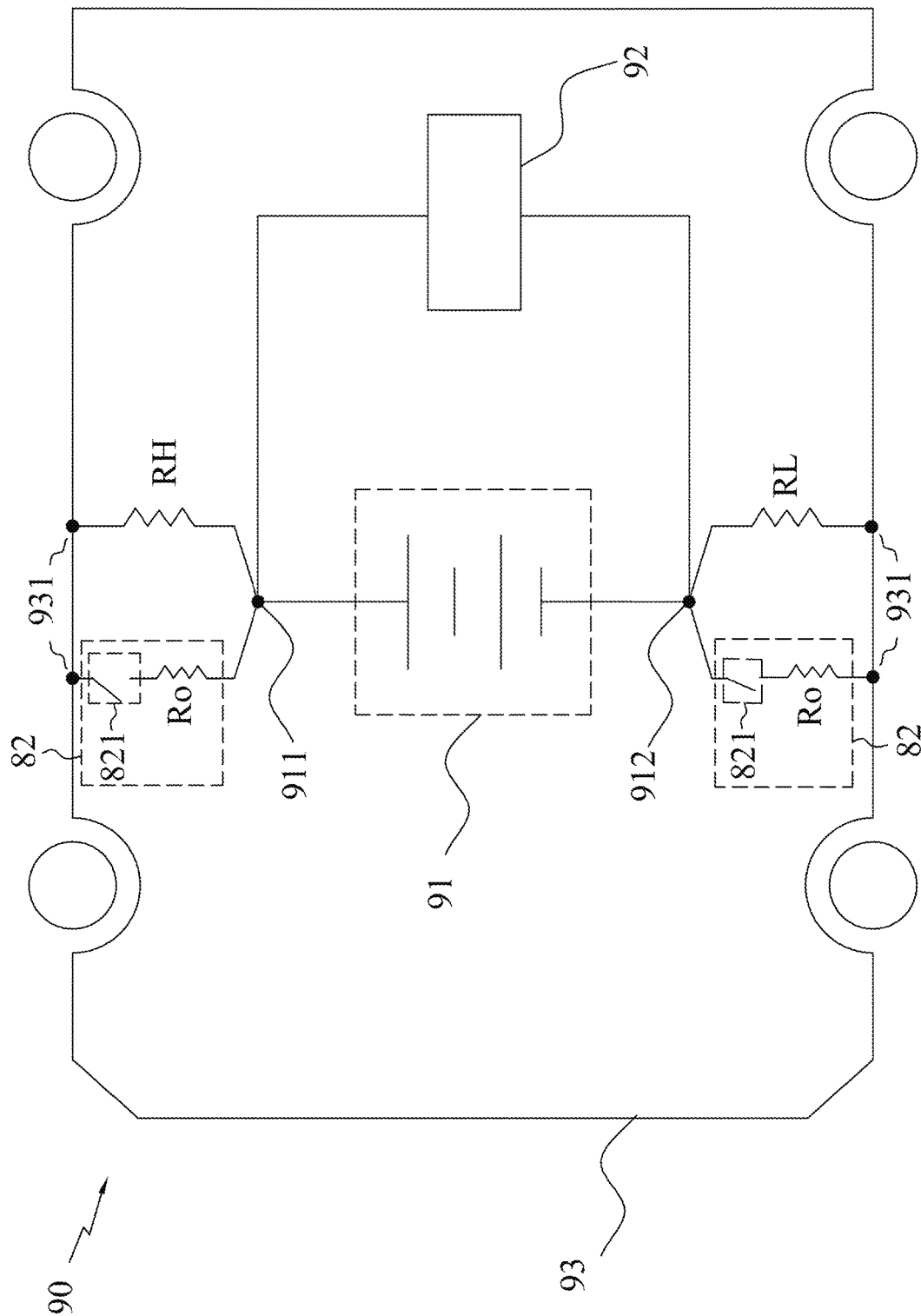
FIG. 2 is a schematic diagram illustrating a conventional measuring module for measuring an insulation resistance between the high voltage battery system and a vehicle body of the electric vehicle.
Figure 3:
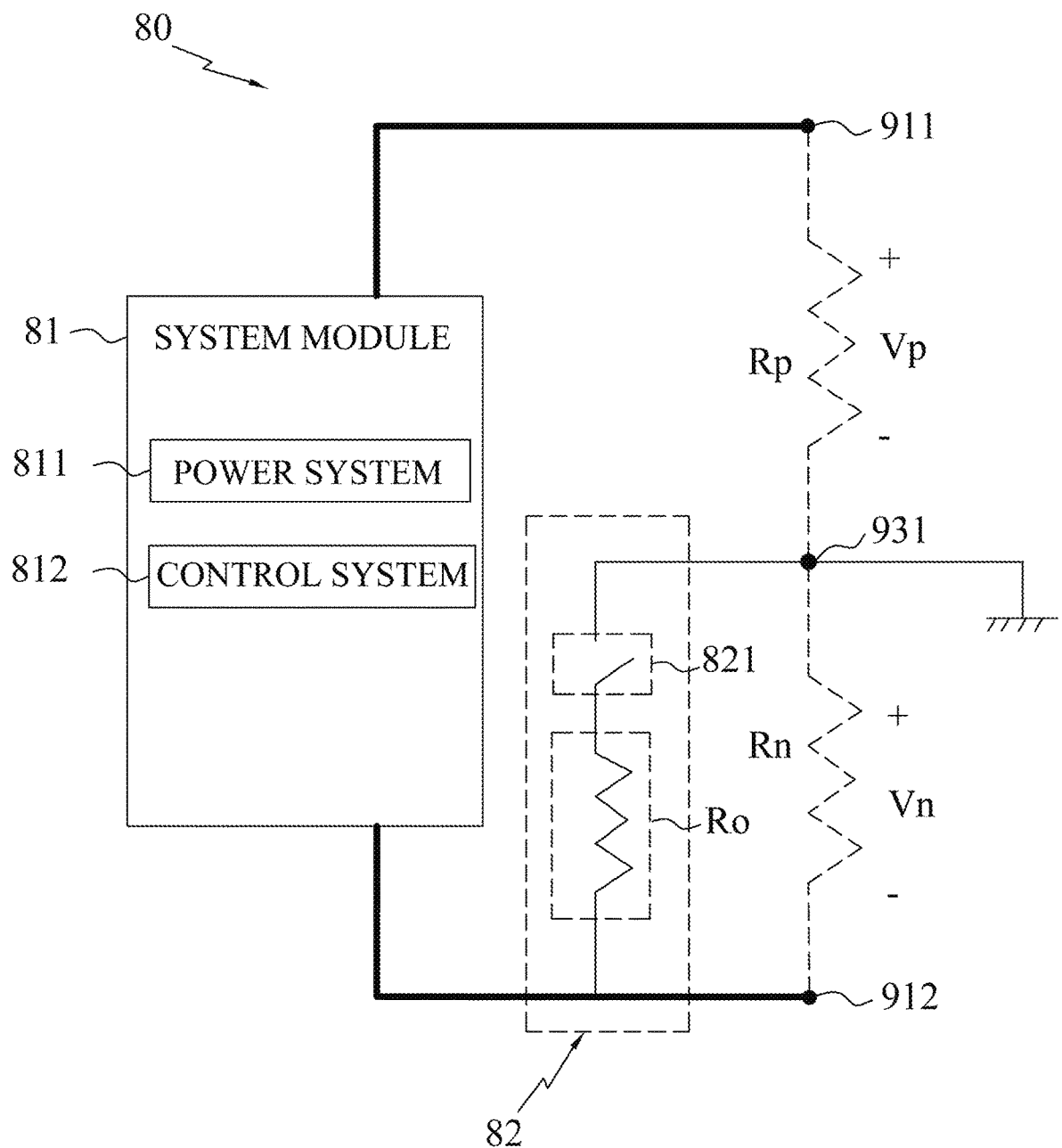
FIG. 3 is a circuit diagram of the conventional measuring module, wherein a switch is turned off.
Figure 4:
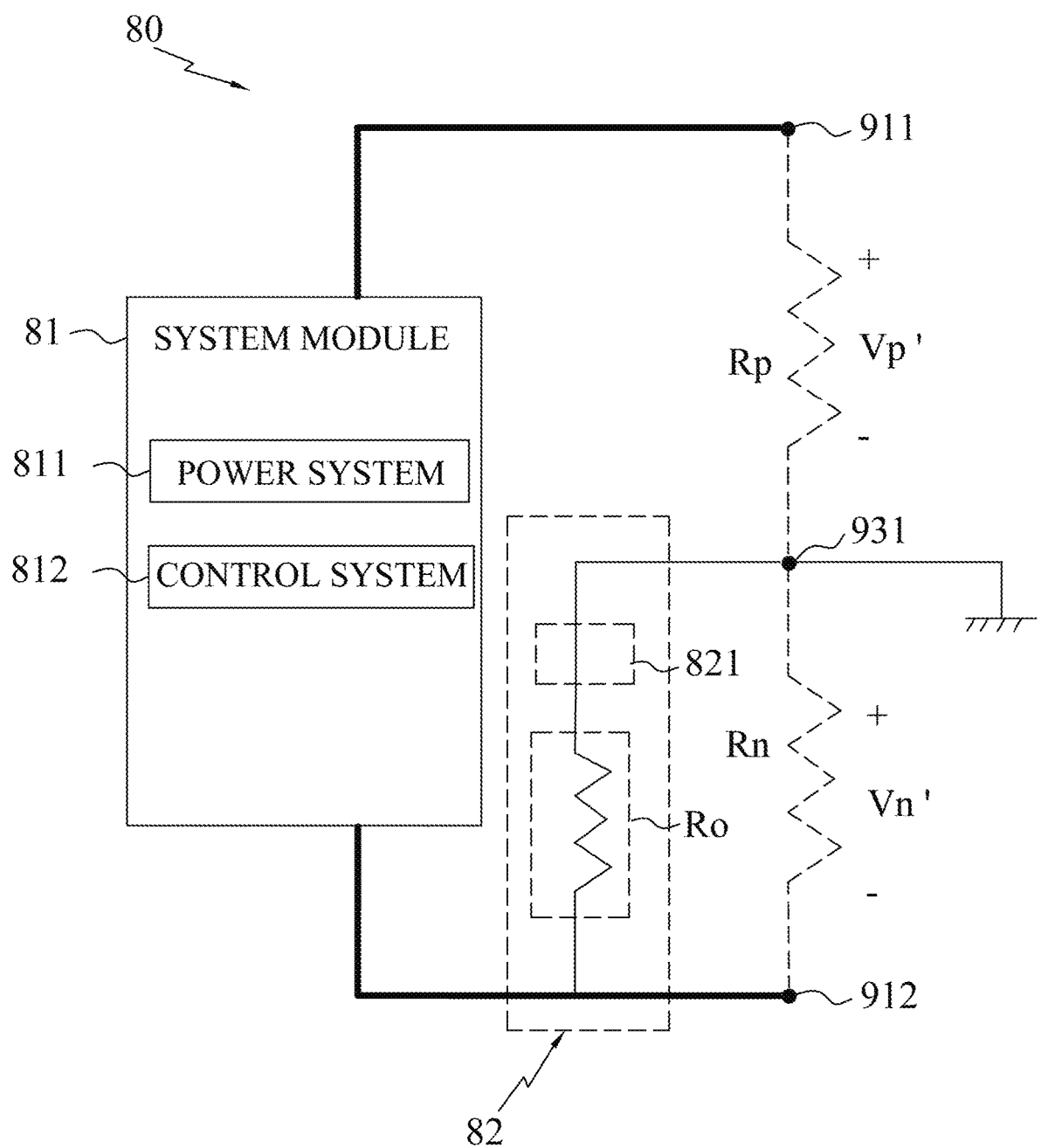

Referring to FIG. 1, an electric vehicle 90 has a high voltage battery system 91 and a motor system 92, the high voltage battery system 91 is connected to the motor system 92 and installed in a vehicle body 93. A positive electrode insulation resistance RH is a resistance between a positive side 911 of the high voltage battery system 91 and a ground side 931 of the vehicle body 93, a negative electrode insulation resistance RL is a resistance between a negative side 912 of the high voltage battery system 91 and the ground side 931 of the vehicle body 93.

Figure 5:
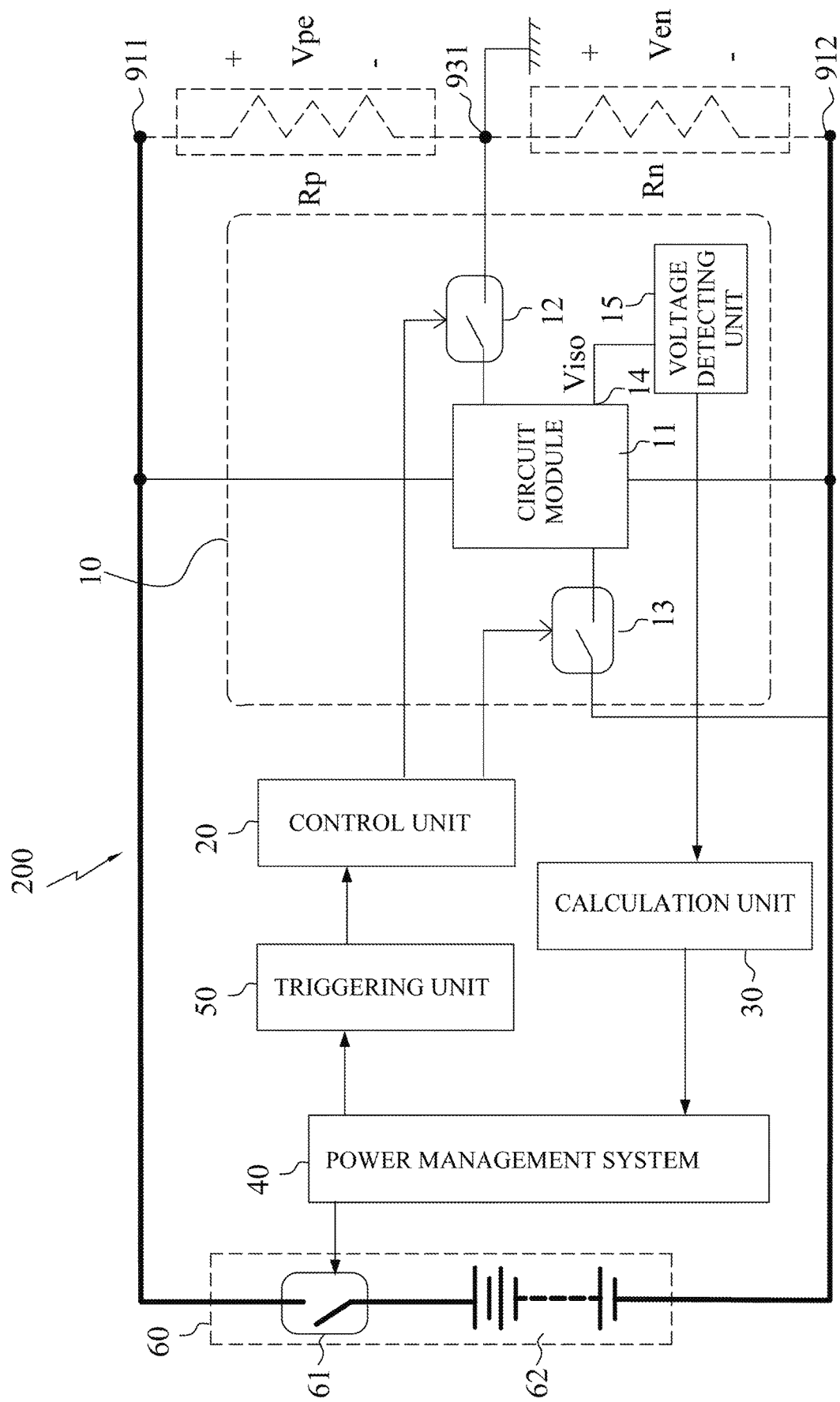
FIG. 5 is a circuit diagram illustrating an insulation resistance measuring device for measuring an insulation resistance between the high voltage battery system and the vehicle body of the electric vehicle of the present invention.

Referring to FIG. 5, an insulation resistance measuring device 200 comprises a measuring unit 10, a control unit 20, a calculation unit 30, a power management system 40, a triggering unit 50 and a battery system 60. The battery system 60 is connected between the positive side 911 and the negative side 912 of the high voltage battery system 91. A positive electrode insulation resistance Rp is a resistance between the positive side 911 of the high voltage battery system 91 and the ground side 931 of the vehicle body 93, specifically, the positive electrode insulation resistance RH is equal to the positive electrode insulation resistance Rp. A negative electrode insulation resistance Rn is a resistance between the negative side 912 of the high voltage battery system 91 and the ground side 931 of the vehicle body 93, specifically, the negative electrode insulation resistance RL is equal to the negative electrode insulation resistance Rn.

The measuring unit 10 comprises a circuit module 11, a first switch 12, a second switch 13, a measuring node 14 and a voltage detecting unit 15. The circuit module 11 includes a plurality of resistors which are connected in series or in parallel, and the circuit module 11 is connected between the positive side 911 and the negative side 912. The first switch 12 is connected between the circuit module 11 and the ground side 931. The second switch 13 is connected between the circuit module 11 and the negative side 912. The measuring node 14 is arranged at one of connecting nodes of the circuit module 11. The voltage detecting unit 15 is electronically connected to the measuring node 14 for detecting a voltage of the measuring node 14. The voltage detecting unit 15 comprises an analog-to-digital converter (not shown in figures) which can convert a detected analog signal of the voltage of the measuring node 14 into a digital signal.

The control unit 20 is connected to the first switch 12 and the second switch 13 respectively, and the control unit 20 is configured to turn on the first switch 12 and the second switch 13 or turn off the first switch 12 and the second switch 13.

The voltage detecting unit 15 is electrically connected to the measuring node 14 of the circuit module 11, and the calculation unit 30, respectively. The calculation unit 30 is connected to the voltage detecting unit 15 and receives the voltage of the measuring node 14 which is detected from the voltage detecting unit 15, the calculation unit 30 is configured to calculate the positive electrode insulation resistance Rp and the negative electrode insulation resistance Rn by using a plurality of circuit functions or equations.

The power management system 40 is connected to the calculation unit 30, the triggering unit 50, and the battery system 60, the power management system 40 is configured to acquire the positive electrode insulation resistance Rp and the negative electrode insulation resistance Rn from the calculation unit 30, and then further determine whether the positive electrode insulation resistance Rp and the negative electrode insulation resistance Rn exceed a default value or not, if the Rp or Rn exceeds the default value, the power management system 40 closes the battery system 60. Therefore, the triggering unit 50 is configured to plan a triggering event for operating the control unit 20.

The battery system 60 comprises a power switch 61 and a battery pack 62, the power switch 61 is controlled by the power management system 40 to be turned on or turned off, and the battery pack 62 is connected between the positive side 911 and the negative side 912. The power switch 61 connects between the battery pack 62 and the positive side 911, or the power switch 61 connects between the battery pack 62 and the negative side 912.

Figure 6:
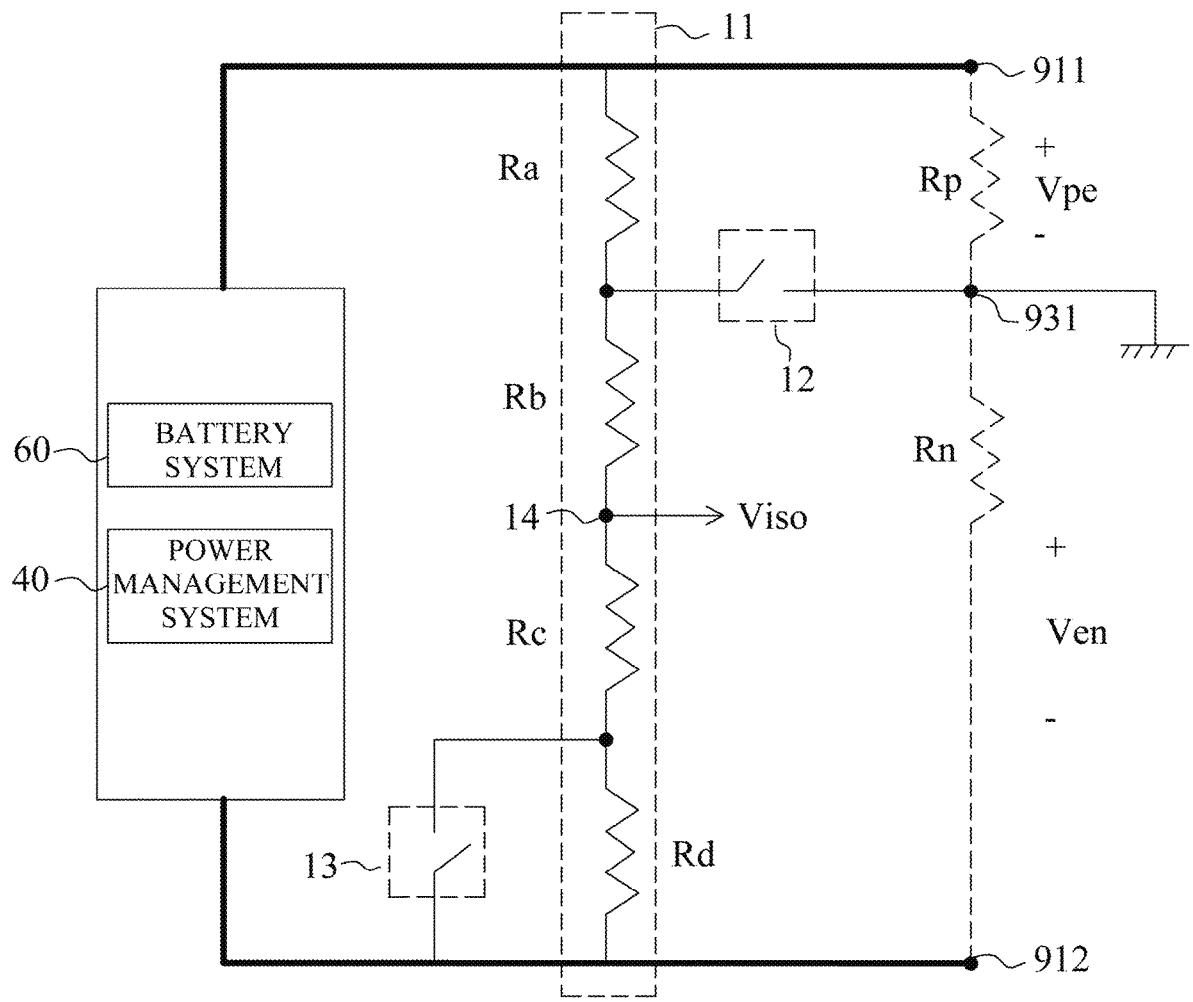
FIG. 6 is a circuit diagram of a first embodiment of the insulation resistance measuring device of the present invention.

Referring to FIG. 6, the first embodiment of the present invention is shown. The circuit module 11 comprises a first resistor Ra, a second resistor Rb, a third resistor Rc and a fourth resistor Rd, and the first resistor Ra is connected to the second resistor Rb, the third resistor Rc and the fourth resistor Rd in series. One end of the first resistor Ra is connected to the positive side 911, and one end of the fourth resistor Rd is connected to the negative side 912. One end of the first switch 12 is connected between the first resistor Ra and the second resistor Rb, and other end of the first switch 12 is connected the ground side 931. One end of the second switch 13 is connected between the third resistor Rc and the fourth resistor Rd, and other end of the second switch 13 is connected the negative side 912. The measuring node 14 is arranged at a connecting node between the second resistor Rb and the third resistor Rc, the voltage detecting unit 15 is connected to the measuring node 14 (FIG. 5 is shown).

Figure 7:
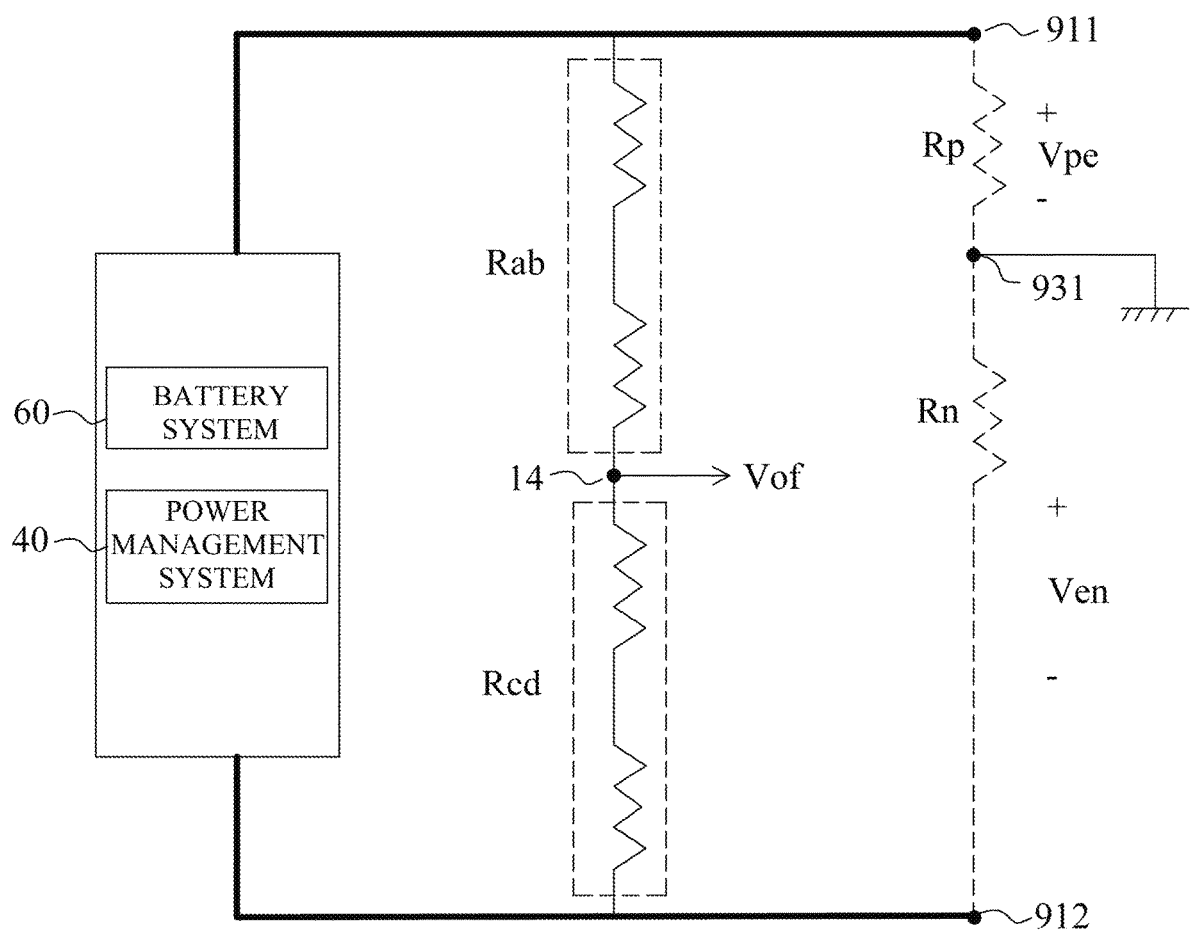
FIG. 7 is a circuit diagram of the first embodiment of the insulation resistance measuring device of the present invention, wherein a first switch is turned off and a second switch is turned off.

Referring to FIG. 7, when the first switch 12 is turned off and the second switch 13 is turned off, the voltage detecting unit 15 detects a first voltage Vof from the measuring node 14, and then the calculation unit 30 calculates a second voltage Vpack with a first circuit equation, the second voltage Vpack is a voltage between the positive side 911 and the negative side 912, the first circuit equation for calculating the second voltage Vpack can be represented as:

$$Vpack = Vof \times \left(\frac{Rab + Rcd}{Rcd}\right)$$

Figure 8:
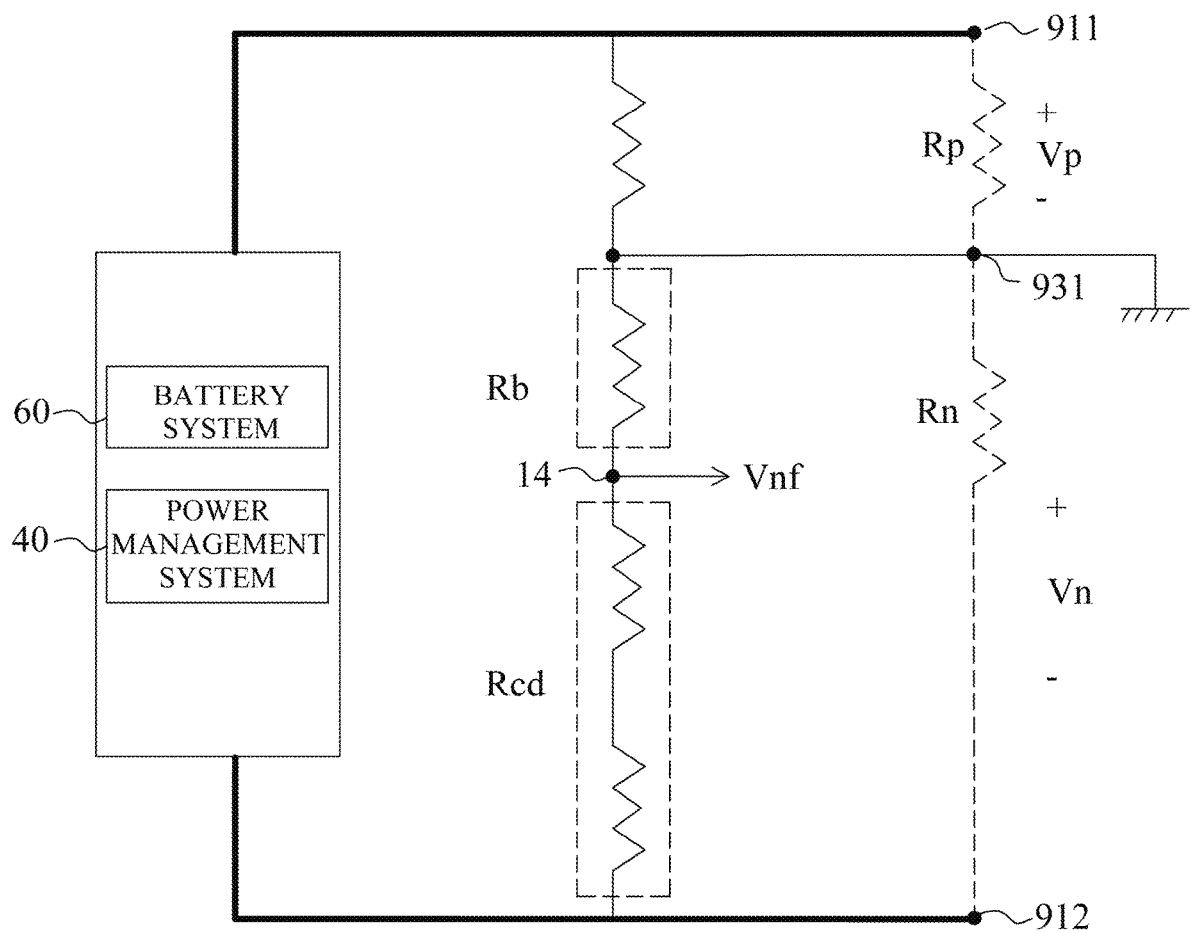
FIG. 8 is a circuit diagram of the first embodiment of the insulation resistance measuring device of the present invention, wherein the first switch is turned on and the second switch is turned off.

Referring to FIG. 8, when the first switch 12 is turned on and the second switch 13 is turned off, the voltage detecting unit 15 detects a third voltage Vnf from the measuring node 14, and then the calculation unit 30 calculates a fourth voltage Vn with a second circuit equation, the fourth voltage Vn is a voltage between the ground side 931 and negative side 912, the second circuit equation for calculating the fourth voltage Vn can be represented as:

$$Vn = Vnf \times \left(\frac{Rb + Rcd}{Rcd}\right)$$

Figure 9:
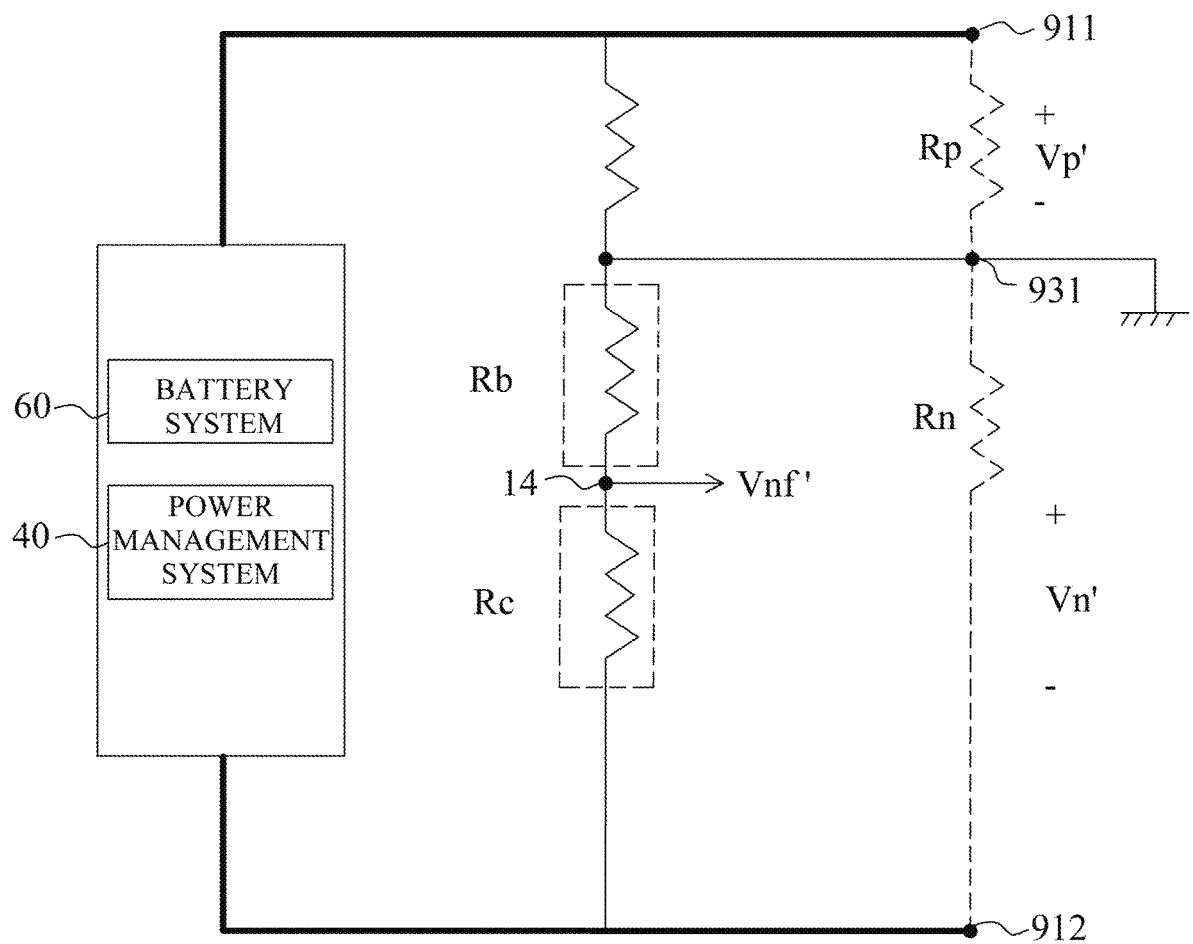
FIG. 9 is a circuit diagram of the first embodiment of the insulation resistance measuring device of the present invention, wherein the first switch is turned on and the second switch is turned off.

Referring to FIG. 9, when the first switch 12 is turned on and the second switch 13 is turned on, the voltage detecting unit 15 detects a fifth voltage Vnf' from the measuring node 14, and then the calculation unit 30 calculates a sixth voltage Vn' with a third circuit equation, the sixth voltage Vn' is a voltage between the ground side 931 and negative side 912, the third circuit equation for calculating the sixth voltage Vn' can be represented as:

$$Vn' = Vnf' \times \left(\frac{Rb + Rc}{Rc}\right)$$

When the calculation unit 30 acquires the second voltage Vpack, the fourth voltage Vn and the sixth voltage Vn', the calculation unit 30 calculates a seventh voltage Vp and an eighth voltage Vp'. The seventh voltage Vp is a voltage between the positive side 911 and the ground side 931 when the first switch 12 is turned on and the second switch 13 is turned off, and the seventh voltage Vp is gotten from that the second voltage Vpack minus the fourth voltage Vn. The eighth voltage Vp' is a voltage between the positive side 911 and the ground side 931 when the first switch 12 is turned on and the second switch 13 is turned on, and the eighth voltage Vp' is gotten from that the second voltage Vpack minus the sixth voltage Vn'.

The calculation unit 30 calculates the fourth voltage Vn, the sixth voltage Vn', the seventh voltage Vp and the eighth voltage Vp' to obtain a first function M, the M* can be represented as:

$$M^* = \left(\frac{Vp'}{Vp} \times \frac{Vn}{Vn'}\right)$$

Referring to FIG. 8, when the first switch 12 is turned on and the second switch 13 is turned off, an Equation [1] may be derived from the circuit analysis and the equation [1] is calculated by the calculation unit 30. The Equation [1] can be represented as:

$$\frac{Vp}{Ra \| Rp} = \frac{Vn}{(Rb + Rc + Rd) \| Rn},\qquad \text{Equation [1]}$$

Referring to FIG. 9, when the first switch 12 is turned on and the second switch 13 is turned on, an Equation [2] may be derived from the circuit analysis and the equation [2] is calculated by the calculation unit 30. The Equation [2] can be represented as:

$$\frac{Vp'}{Ra \| Rp} = \frac{Vn'}{(Rb + Rc) \| Rn},\qquad \text{Equation [2]}$$

Substituting the Equation [1] into the Equation [2], and then solves and yields the positive electrode insulation resistance Rp and the negative electrode insulation resistance Rn.

A second function represents the negative electrode insulation resistance Rn which can be represented as:

$$Rn = \frac{1 - M^*}{M^* \left(\frac{1}{Rb + Rc + Rd}\right) - \left(\frac{1}{Rb + Rc}\right)}$$

A third function represents the positive electrode insulation resistance Rp which can be represented as:

$$Rp = \left[\frac{Vn}{Vp} \times \frac{1}{(Rb + Rc + Rd) \| Rn} - \frac{1}{Ra}\right]^{-1}$$

Since resistances of these resistors are predetermined and the first function is also predetermined during detecting the measuring node 14 in different states of the switches; therefore, the resistance value of the negative electrode insulation resistance Rn and the resistance value of the positive electrode insulation resistance Rp may be acquired via the calculation unit 30 calculating the equations and the functions described above.

Figure 10:
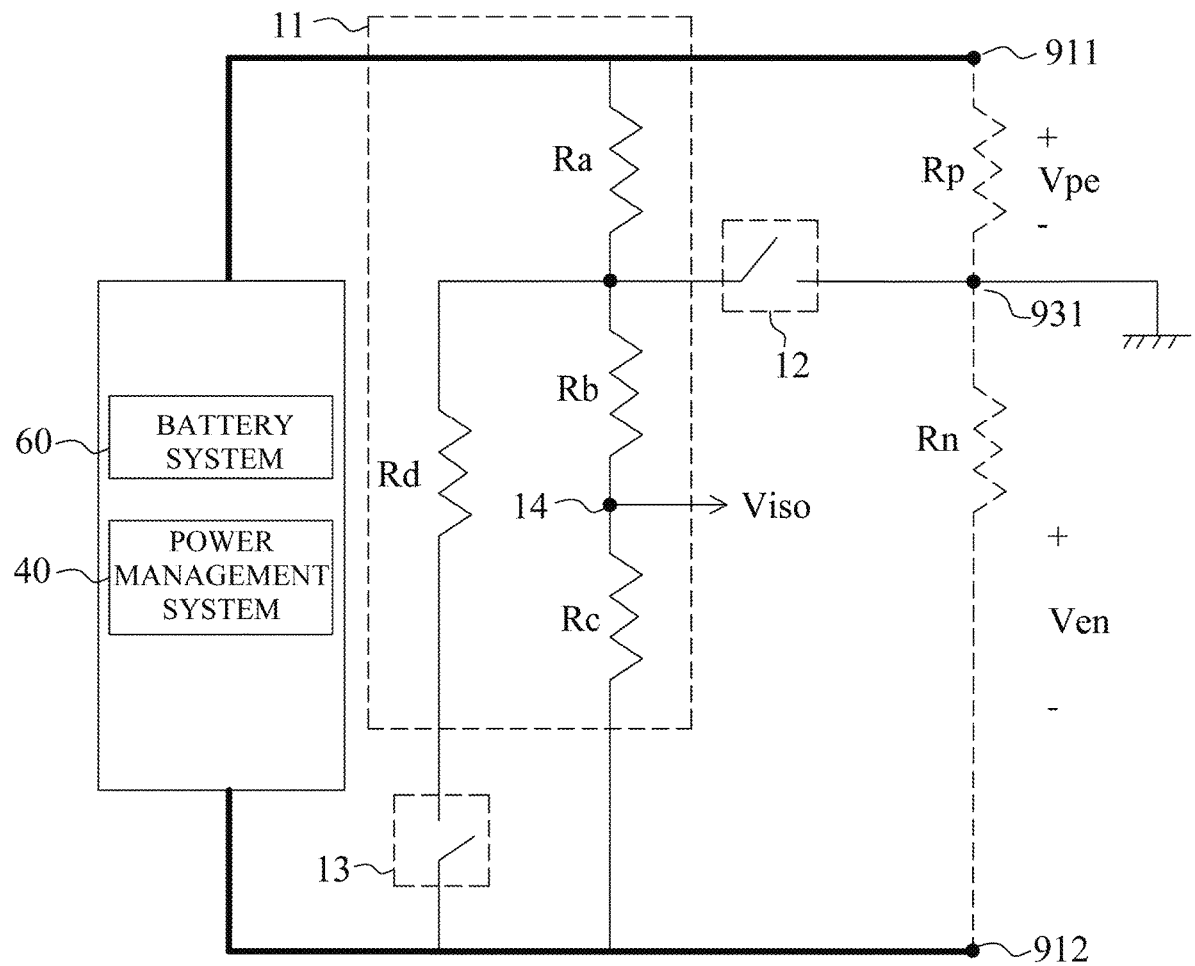
FIG. 10 is a circuit diagram of a second embodiment of the insulation resistance measuring device of the present invention.

Referring to FIG. 10, the second embodiment of the present invention is shown. The circuit module 11 has a different circuit design, the circuit module 11 comprises the first resistor Ra, the second resistor Rb, the third resistor Rc and the fourth resistor Rd. The first resistor Ra is connected to the second resistor Rb, and the third resistor Rc in series. One end of the first resistor Ra is connected to the positive side 911, and one end of third resistor Rc is connected to the negative side 912. One end of the first switch 12 is connected between the first resistor Ra and the second resistor Rb and the other end of the first switch 12 is connected to the ground side 931. The measuring node 14 is arranged at the connecting node between the second resistor Rb and the third resistor Rc, the voltage detecting unit 15 is connected to the measuring node 14 (FIG. 5 is shown). One end of the fourth resistor Rd is connected to a connecting node between the first resistor Ra and the second resistor Rb, the other end of the fourth resistor Rd is connected to one end of the second switch 13, and the other end of the second switch 13 is connected to the negative side 912. Therefore, the second resistor Rb and the third resistor Rc are in parallel with the fourth resistor Rd.

Figure 11:
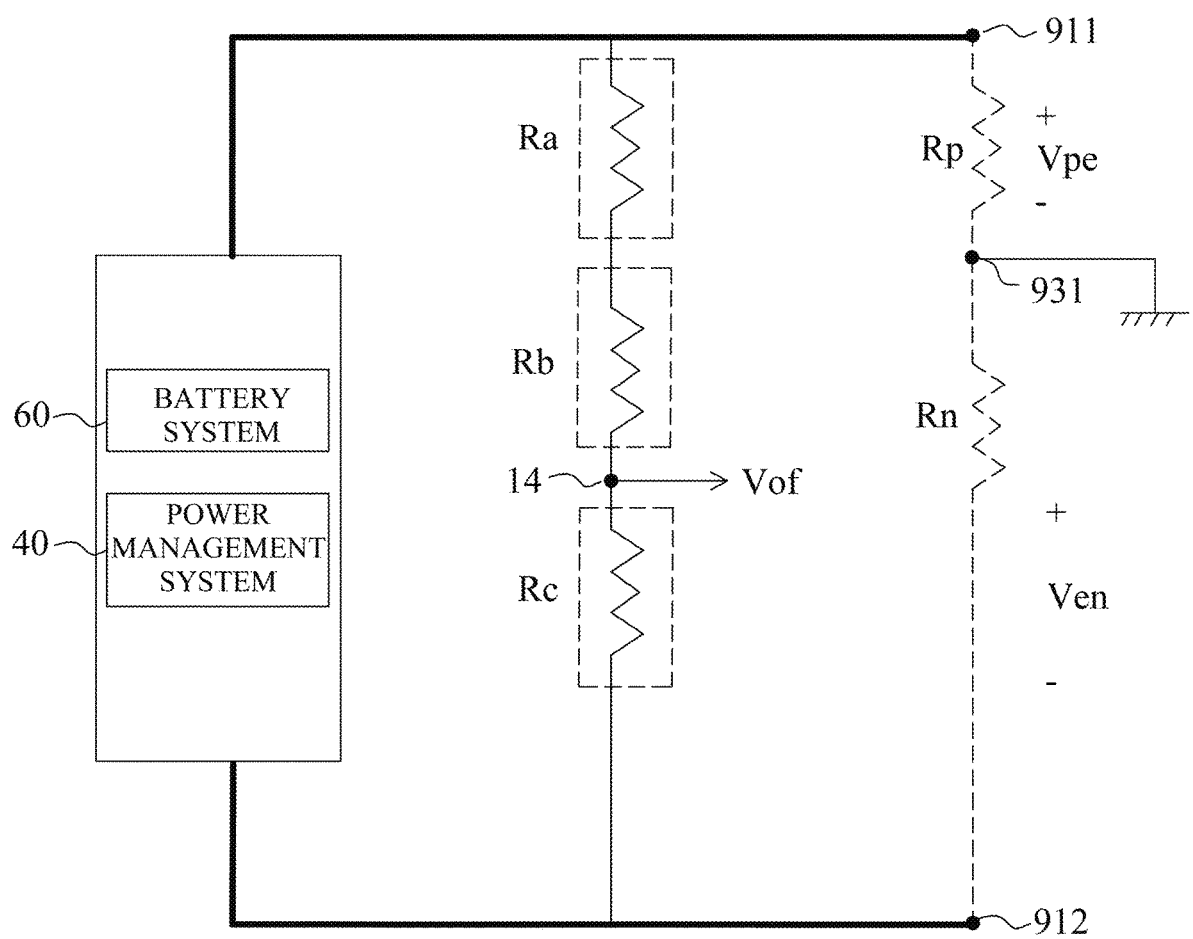
FIG. 11 is a circuit diagram of the second embodiment of the insulation resistance measuring device of the present invention, wherein the first switch is turned off and the second switch is turned off.

Referring to FIG. 11, when the first switch 12 is turned off and the second switch 13 is turned off, the voltage detecting unit 15 detects the first voltage Vof from the measuring node 14, and then the calculation unit 30 calculates the second voltage Vpack with a first circuit equation, the second voltage Vpack is the voltage between the positive side 911 and the negative side 912, the first circuit equation for calculating the second voltage Vpack can be represented as:

$$Vpack = Vof \times \left(\frac{Rab + Rc}{Rc}\right)$$

Figure 12:
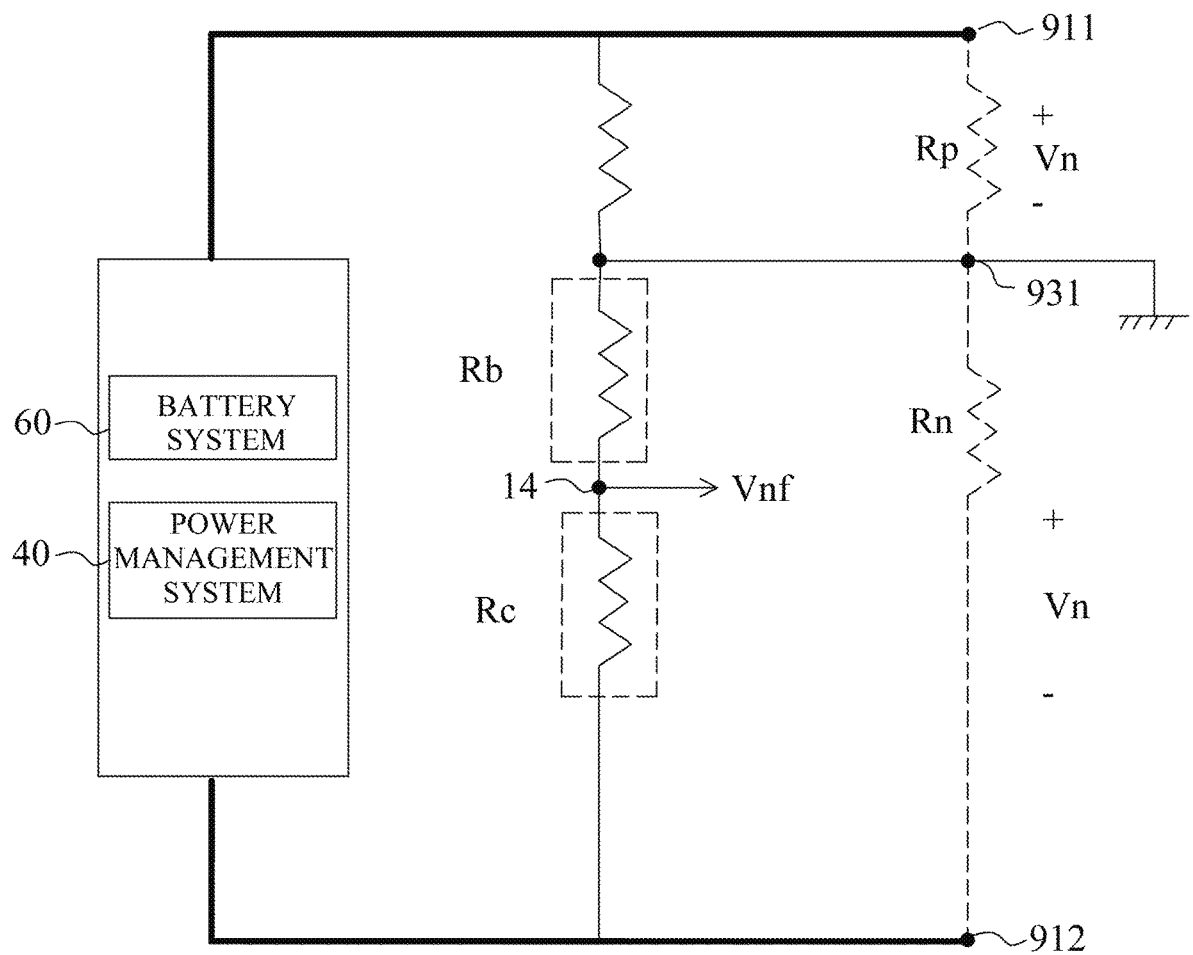
FIG. 12 is a circuit diagram of the second embodiment of the insulation resistance measuring device of the present invention, wherein the first switch is turned on and the second switch is turned off.

Referring to FIG. 12, when the first switch 12 is turned on and the second switch 13 is turned off, the voltage detecting unit 15 detects the third voltage Vnf from the measuring node 14, and then the calculation unit 30 calculates the fourth voltage Vn with a second circuit equation, the fourth voltage Vn is the voltage between the ground side 931 and negative side 912, the second circuit equation for calculating the fourth voltage Vn can be represented as:

$$Vn = Vnf \times \left(\frac{Rb + Rc}{Rc}\right)$$

Figure 13:
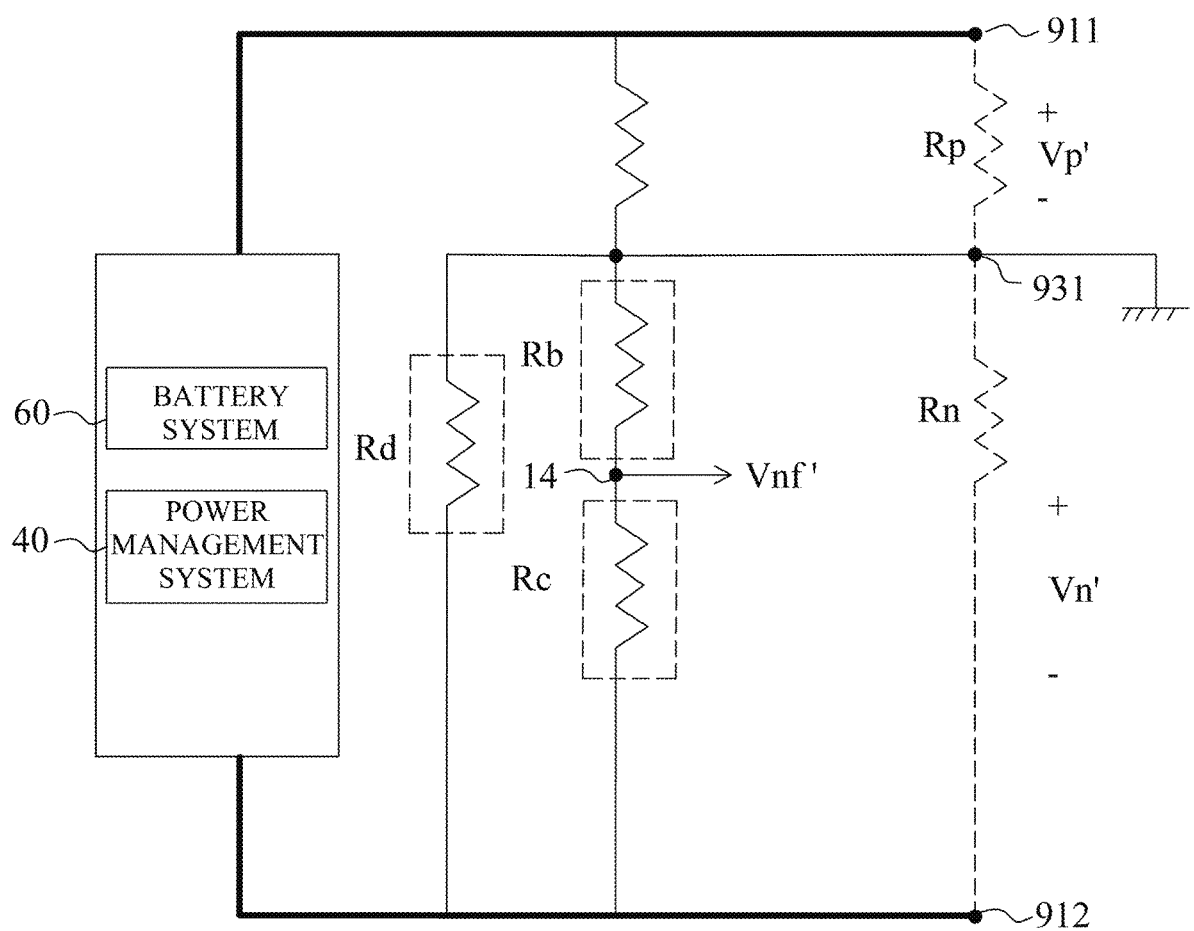

Referring to FIG. 13, when the first switch 12 is turned on and the second switch 13 is turned on, the voltage detecting unit 15 detects the fifth voltage Vnf' from the measuring node 14, and then the calculation unit 30 calculates the sixth voltage Vn' with a third circuit equation, the sixth voltage Vn' is the voltage between the ground side 931 and negative side 912, the third circuit equation for calculating the sixth voltage Vn' can be represented as:

$$Vn' = Vnf' \times \left(\frac{Rb + Rc}{Rc}\right)$$

When the calculation unit 30 acquires the second voltage Vpack, the fourth voltage Vn and the sixth voltage Vn', the calculation unit 30 calculates the seventh voltage Vp and the eighth voltage Vp'. The seventh voltage Vp is the voltage between the positive side 911 and the ground side 931 when the first switch 12 is turned on and the second switch 13 is turned off, and the seventh voltage Vp is gotten from that the second voltage Vpack minus the fourth voltage Vn. The eighth voltage Vp' is the voltage between the positive side 911 and the ground side 931 when the first switch 12 is turned on and the second switch 13 is turned on, and the eighth voltage Vp' is gotten from that the second voltage Vpack minus the sixth voltage Vn'.

The calculation unit 30 calculates the fourth voltage Vn, the sixth voltage Vn', the seventh voltage Vp and the eighth voltage Vp' to obtain the first function M, the M* can be represented as:

$$M^* = \left(\frac{Vp'}{Vp} \times \frac{Vn}{Vn'}\right)$$

Referring to FIG. 12, when the first switch 12 is turned on and the second switch 13 is turned off, an Equation [3] may be derived from the circuit analysis and the equation [3] is calculated by the calculation unit 30. The Equation [3] can be represented as:

$$\frac{Vp}{Ra \| Rp} = \frac{Vn}{(Rb + Rc) \| Rn},\quad \text{Equation [3]}$$

Referring to FIG. 13, when the first switch 12 is turned on and the second switch 13 is turned on, an Equation [4] may be derived from the circuit analysis and the equation [4] is calculated by the calculation unit 30. The Equation [4] can be represented as:

$$\frac{Vp'}{Ra \| Rp} = \frac{Vn'}{Rd \| (Rb + Rc) \| Rn},\quad \text{Equation [4]}$$

Substituting the Equation [3] into the Equation [4], and then solves and yields the positive electrode insulation resistance Rp and the negative electrode insulation resistance Rn.

The second function represents the negative electrode insulation resistance Rn which can be represented as:

$$Rn = \left[ \frac{1}{(M^* - 1) \times Rd} - \frac{1}{(Rb + Rc)} \right]^{-1}$$

The third function represents the positive electrode insulation resistance Rp which can be represented as:

$$Rp = \left[ \frac{1}{\frac{Vp}{Vn} \times (M^* - 1) \times Rd} - \frac{1}{Ra} \right]^{-1}$$

Since resistances of these resistors are predetermined and the first function is also predetermined during detecting the measuring node 14 in different states of the switches; therefore, the resistance value of the negative electrode insulation resistance Rn and the resistance value of the positive electrode insulation resistance Rp may be calculated via the calculation unit 30.

Figure 14:
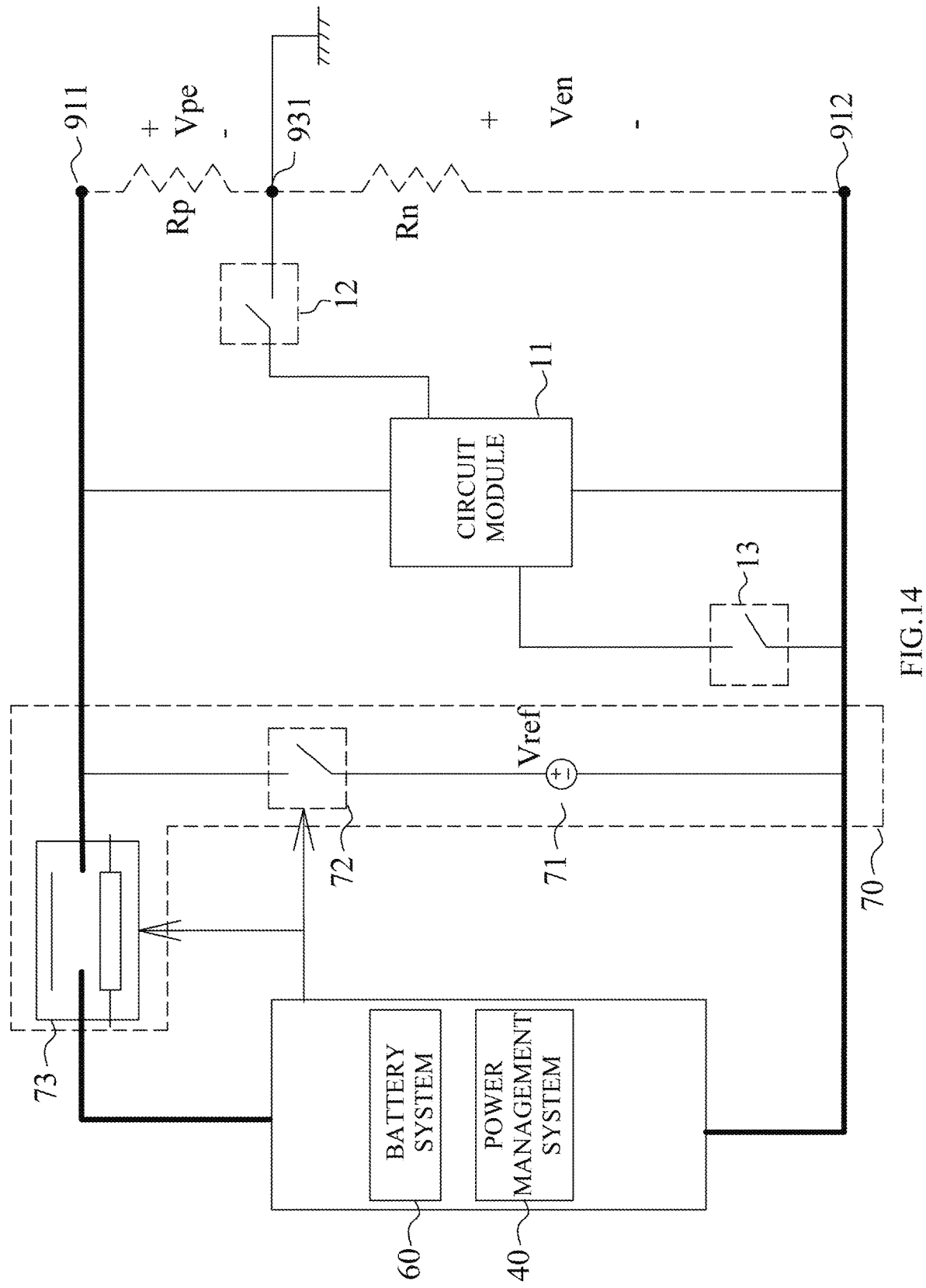
FIG. 14 is a circuit diagram of a third embodiment of the insulation resistance measuring device of the present invention.

Referring to FIG. 14, the third embodiment of the present invention is shown. An additional voltage system 70 is arranged in the insulation resistance measuring device 200, which can apply in the first embodiment and the second embodiment.

The additional voltage system 70 comprises a power supply 71, a third switch 72 and a fourth switch 73. The power supply 71 and the third switch 72 are connected in series and between the positive side 911 and the negative side 912. The fourth switch 73 is connected between the positive side 911 and the power management system 40. The power management system 40 can control the third switch 72 and the fourth switch 73 to turn on or turn off. When the third switch 72 is turned on, the fourth switch 73 is turned off. When the third switch 72 is turned off, the fourth switch 73 is turned on.

A voltage of the additional voltage system 70 is lower than a voltage of the battery system 60. Therefore, when the third switch 72 is turned on and the fourth switch 73 is turned off, the battery pack 62 is isolated from the measuring unit 10 and the power supply 71 is connected to the measuring unit 10, the additional voltage system 70 is used to be a test voltage for detecting the insulation resistances. When the insulation resistance Rn and the insulation resistance Rp are calculated and judged within a safety range, the third switch 72 is turned off and the fourth switch 73 is turned on. Therefore, the power supply 71 is isolated from the measuring unit 10 and the battery system 60 is connected to the measuring unit 10. The design of the additional voltage system 70 can reduce the danger in the high-voltage and has more safety.

As will be understood by those familiar with the art, the present invention may be embodied in other specific forms without departing from the spirit or essential characteristics thereof. Accordingly, the disclosures and descriptions herein are intended to be illustrative, but not limiting, of the scope of the invention which is set fourth in the following claims.

What is claimed is:

1. An insulation resistance measuring device for detecting insulation resistance of an electric vehicle which comprises a ground side and a battery system having a positive side and a negative side, the insulation resistance measuring device comprising:
  a measuring unit comprising:
    a circuit module comprising a plurality of resistances, wherein the circuit module is connected to both the positive side and the negative side of the battery system,
    a first switch connected between the circuit module and the ground side of the electric vehicle,
    a second switch connected between the circuit module and the negative side of the battery system, and
    a voltage detecting unit arranged at a first connecting node of the circuit module;
  a control unit configured to control the operation of the first switch and the operation of the second switch;
  a power management system;
  a triggering unit;
  a calculation unit, wherein the voltage detecting unit is electrically connected to the first connecting node of the circuit module, and the calculation unit, respectively,
  wherein the power management system is connected to the calculation unit and the battery system, and wherein the calculation unit is connected to the voltage detecting unit and configured to:
    acquire a first voltage of the first connecting node via the voltage detecting unit when the first switch and the second switch are in a first state,
    calculate a second voltage between the positive side and the negative side of the battery system by using the first voltage in a first circuit equation,
    acquire a third voltage of the first connecting node via the voltage detecting unit when the first switch and the second switch are in a second state,
    calculate a fourth voltage between the ground side of the electric vehicle and negative side of the battery system by using the third voltage in a second circuit equation,
    acquire a fifth voltage of the first connecting node via the voltage detecting unit when the first switch and the second switch are in a third state,
    calculate a sixth voltage between the ground side of the electric vehicle and negative side of the battery system by by using the fifth voltage in a third circuit equation,
    calculate a seventh voltage between the positive side and the ground side of the electric vehicle when the first switch and the second switch are in the second state, wherein the seventh voltage is equal to the second voltage minus the fourth voltage, calculate an eighth voltage between the positive side of the battery system and the ground side of the electric vehicle when the first switch and the second switch are in the third state, wherein the eighth voltage is equal to the second voltage minus the sixth voltage, operate a first function M*, said first function M* comprising a relationship between the fourth voltage, the sixth voltage, the seventh voltage and the eighth voltage;

calculate a negative electrode insulation resistance Rn which is an insulation resistance between the negative side of the battery system and the ground side of the electric vehicle by using the first function M* and a second function, and calculate a positive electrode insulation resistance Rp which is an insulation resistance between the positive side of the battery system and the ground side of the electric vehicle by using the first function M*, the second function and a third function, wherein the power management system is connected to the calculation unit, the triggering unit, and the battery system, the power management system configured to:

acquire the positive electrode insulation resistance Rp and the negative electrode insulation resistance Rn from the calculation unit, and then determine whether the positive electrode insulation resistance Rp and the negative electrode insulation resistance Rn exceed a default value, and then if the positive electrode insulation resistance Rp or the negative electrode insulation resistance Rn exceeds the default value, the power management system is configured to plan a triggering even for operating the control unit by closing the battery system.

2. The insulation resistance measuring device as claimed in claim 1, wherein the first function M* is represented by Expression:

$$M^* = \left(\frac{Vp'}{Vp} \times \frac{Vn}{Vn'}\right),$$

in which Vn represents the fourth voltage, Vn' represents the sixth voltage, Vp represents the seventh voltage, and Vp' represents the eighth voltage.

3. The insulation resistance measuring device as claimed in claim 2, wherein:

the circuit module comprises a first resistor, a second resistor, a third resistor and a fourth resistor, wherein the first resistor is connected in series with the second resistor, the third resistor and the fourth resistor, and one end of the first resistor is connected to the positive side of the battery system, one end of the fourth resistor is connected to the negative side of the battery system; and the first connecting node is between the second resistor and the third resistor.

4. The insulation resistance measuring device as claimed in claim 3, wherein one end of the first switch is connected to a second connecting node between the first resistor and the second resistor, and the other end of the first switch is connected to the ground side of the electric vehicle, one end of the second switch is connected to a third connecting node between the third resistor and the fourth resistor, and the other end of the second switch is connected to the negative side of the battery system, the voltage detecting unit is arranged at a connecting node between the second resistance and third resistance.

5. The insulation resistance measuring device as claimed in claim 4, wherein the second function for obtaining the negative electrode insulation resistance Rn is $$Rn = \frac{1 - M^*}{M^* \left(\frac{1}{Rb + Rc + Rd}\right) - \left(\frac{1}{Rb + Rc}\right)},$$

and the third function for obtaining the positive electrode insulation resistance Rp is $$Rp = \left[\frac{Vn}{Vp} \times \frac{1}{(Rb + Rc + Rd)\|Rn} - \frac{1}{Ra}\right]^{-1},$$

in which Ra represents the resistance of the first resistor, Rb represents the resistance of the second resistor, Rc represents the resistance of the third resistor, and Rd represents the resistance of the fourth resistor.

6. The insulation resistance measuring device as claimed in claim 1, wherein the resistances comprises a first resistance, a second resistance, a third resistance and a fourth resistance, the first resistance is connected in series with the second resistance and the third resistance, and one end of the first resistance is connected to the positive side of the battery system, one end of the third resistance is connected to the negative side of the battery system, one end of the fourth resistance is connected to a connecting node between the first resistance and second resistance, the other end of the fourth resistance is connected to the second switch, the fourth resistance is parallel with the second resistance and the third resistance.

7. The insulation resistance measuring device as claimed in claim 6, wherein the first switch is connected between the first resistance and the second resistance, the voltage detecting unit is arranged at a connecting node between the second resistance and third resistance.

8. The insulation resistance measuring device as claimed in claim 7, wherein the second function is represented by Expression Rn, $$Rn = \left[\frac{1}{(M^* - 1) \times Rd} - \frac{1}{(Rb + Rc)}\right]^{-1},$$

and the third function is represented by Expression Rp, $$Rp = \left[\frac{1}{\frac{Vp}{Vn} \times (M^* - 1) \times Rd} - \frac{1}{Ra}\right]^{-1},$$

in which M* represents the first function, Vn represents the fourth voltage, Vp represents the seventh voltage, Ra represents the first resistance, Rb represents the second resistance, Rc represents the third resistance, and Rd represents the fourth resistance.

9. The insulation resistance measuring device as claimed in claim 1, further comprising an additional voltage system, wherein the additional voltage system comprises a power supply, a third switch and a fourth switch, wherein the power supply and the third switch are connected in series and between the positive side and the negative side of the battery system, the fourth switch is connected between the positive side of the battery system and a power management system, wherein the power management system is configured to control the operation of the third switch and the operation of the fourth switch, wherein the fourth switch is turned off when the third switch is turned on, and the fourth switch is turned on when the third switch is turned off.

10. The insulation resistance measuring device as claimed in claim 1, wherein the first state is that the first switch is turned off and the second switch is turned off, the second state is that the first switch is turned on and the second switch is turned off, and the third state is that the first switch is turned on and the second switch is turned on.

* * * * *